United States Patent
Fourmont et al.

(10) Patent No.: US 9,685,941 B2
(45) Date of Patent: Jun. 20, 2017

(54) DEVICE FOR PROTECTING AT LEAST ONE ACTIVE COMPONENT OF AN ELECTRONIC MODULE

(71) Applicant: THALES, Neuille sur Seine (FR)

(72) Inventors: Jean-Francois Fourmont, Elancourt (FR); Joel Bernard Francois Herault, Elancourt (FR); Emile Jean Pouderous, Elancourt (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 14/908,977

(22) PCT Filed: Jul. 31, 2014

(86) PCT No.: PCT/EP2014/066460
§ 371 (c)(1),
(2) Date: May 16, 2016

(87) PCT Pub. No.: WO2015/014924
PCT Pub. Date: Feb. 5, 2015

(65) Prior Publication Data
US 2016/0294377 A1    Oct. 6, 2016

(30) Foreign Application Priority Data
Aug. 1, 2013 (FR) ...................... 13 01852

(51) Int. Cl.
*H03K 5/24* (2006.01)
*H03K 17/0812* (2006.01)
*H03K 17/00* (2006.01)

(52) U.S. Cl.
CPC ....... *H03K 17/0812* (2013.01); *H03K 17/007* (2013.01)

(58) Field of Classification Search
USPC .................................. 327/50, 58, 77, 80–81
See application file for complete search history.

(56) References Cited

U.S. PATENT DOCUMENTS

| 5,479,119 A | 12/1995 | Tice et al. |
| 5,563,538 A * | 10/1996 | Mukoujima ....... H03K 5/00006 327/116 |
| 6,867,623 B2 * | 3/2005 | Nishizono ............... H03F 3/087 327/291 |

FOREIGN PATENT DOCUMENTS

| DE | 102006006541 B3 | 7/2007 |
| WO | WO 2007093598 A1 | 8/2007 |

OTHER PUBLICATIONS

Search Report for FR1301852.

* cited by examiner

*Primary Examiner* — An Luu
(74) *Attorney, Agent, or Firm* — Davidson, Davidson & Kappel, LLC

(57) ABSTRACT

The invention relates to a device for protecting at least one active component of an electronic module, able to receive a microwave electromagnetic signal as input and to provide a microwave electromagnetic signal to said at least one active component. This device includes a delay module able to apply a predetermined delay time to the microwave electromagnetic input signal, connected in parallel with a switch-triggering device able to compare a power level of the microwave electromagnetic input signal to a power threshold and to command switching by a switch connected at the output of the delay module, an output of said switch providing the microwave electromagnetic signal to said at least one active component, the predetermined delay time being such that the switching is done before the arrival of the microwave electromagnetic output signal from the delay module.

10 Claims, 1 Drawing Sheet

DEVICE FOR PROTECTING AT LEAST ONE ACTIVE COMPONENT OF AN ELECTRONIC MODULE

Figure 1:
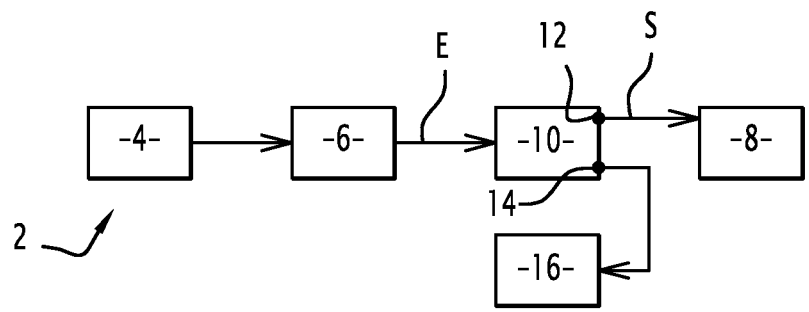

The present invention relates to a device for protecting at least one active component of an electronic module, able to receive a microwave electromagnetic signal as input and to provide a microwave electromagnetic signal to said at least one active component. It also relates to an electronic system including such a protection device.

The invention falls within the field of the amplification of microwave electromagnetic signals, having an associated frequency greater than 0.1 GHz. Such signals are widely used, in particular in telecommunications applications and in radars for various applications, both civilian and military.

In particular, there are various electronic systems including active components, making it possible to increase the power of an electromagnetic signal in linear operation. When an active component works in saturation, the output power of an electromagnetic signal is quasi-constant, irrespective of its input power. A compression rate is associated with the power ratio between the input power and the output power. Depending on the specifications of such a component, a compression rate above a predetermined threshold can lead to the destruction of the component. It is therefore necessary to check the compression rate of such active components.

The issue described above in particular comes into play in the field of radars with active antennas, including a large number of active sources in parallel, for which it is necessary to check the compression rate. In order to limit the compression rate in active antenna radars, systems are known for checking emitted power levels using a software computation. However, such systems assume that the level of the microwave signal is stable over time, which is not always verified in practice. In order to offset the drawbacks of the prior art, according to a first aspect, the invention proposes a protection device of the aforementioned type, which includes a delay module able to apply a predetermined delay time to the microwave electromagnetic input signal, connected in parallel with a switch-triggering device able to compare a power level of the microwave electromagnetic input signal to a power threshold and to command switching by a switch connected at the output of the delay module, an output of said switch providing the microwave electromagnetic input signal of said at least one active component, the predetermined delay time being such that the switching is done before the arrival of the microwave electromagnetic output signal from the delay module.

Advantageously, the device according to the invention makes it possible to check the power level of the electromagnetic input signal and to actuate the triggering of the switch as a function of the level of the electromagnetic input signal. Thus, when the protection device according to the invention is connected upstream from at least one active electronic component, a microwave electromagnetic signal is only sent to such a component if its power level is below a predetermined power threshold, irrespective of the duration of the electromagnetic microwave signal. Furthermore, advantageously, the proposed protection device makes it possible to preserve the integrity of the waveform of the transmitted microwave electromagnetic signal.

The device according to the invention may have one or more of the features below, considered independently or in combination.

the delay module comprises a coaxial inductive delay line with a length computed as a function of the predetermined delay time;

the length of the delay line is computed to ensure a delay time greater than the time comprised between the triggering of the switching by the switch-triggering device and the position change of the switch;

the length X of the line is associated with the delay time $T_r$ by the formula:
$X = v \cdot T_r$ where $$v = \frac{c}{\sqrt{\varepsilon_r}},$$

where c is the speed of light and $\varepsilon_r$ is the permittivity of the delay line; the delay line comprises, at the output of the delay line, an amplifier able to offset a power loss caused by said delay line; the switch-triggering device comprises a power measurer and a level comparator, said comparator being able to compare an output level of said measurer to a level threshold; the level threshold is provided by an external device; it includes a first output and a second output, and the output level of the measurer compared to the level threshold determines the position of the switch between a first position making it possible to convey the electromagnetic signal leaving the delay module toward said first output and a second position making it possible to convey the electromagnetic signal leaving the delay module toward said second output; said microwave electromagnetic signal has a frequency comprised between 0.1 GHz and 40 GHz.

According to a second aspect, the invention proposes an electronic system for amplifying microwave electromagnetic signals including a microwave electromagnetic signal transmitter, an amplification system connected at the output of the transmitter and a module with active components connected at the output of the amplification system. The system according to the invention includes a protection device as briefly described above connected in series between the amplification system and the active component module.

Figure 2:
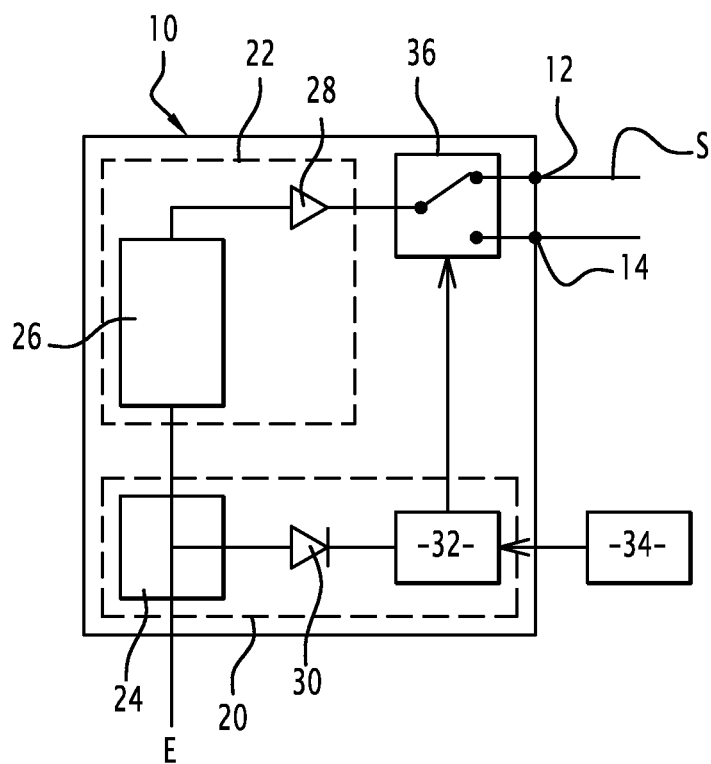

Other features and advantages of the invention will emerge from the description thereof provided below, for information and non-limitingly, in reference to the appended figures, in which:

FIG. 1 is a diagrammatic example of an electronic system including a device according to the invention, and FIG. 2 is a diagrammatic illustration of a device according to the invention.

The invention will be described more particularly as it applies in an active antenna radar system. It is understood that the invention is not limited to this application, and applies in any electronic system requiring a power check of a microwave electromagnetic signal, in particular to protect active components.

FIG. 1 diagrammatically illustrates an electronic system 2, including a transmitter 4 for transmitting microwave electromagnetic signals in the frequency band from 8 GHz to 12 GHz. More generally, the invention applies to any microwave electromagnetic signal with a frequency comprised between 0.1 GHz and 40 GHz. The transmitter 4 is connected at the input of an amplifier system 6, able to amplify a microwave electromagnetic signal received as input. The amplification system 6 is traditionally connected to an electronic module 8 including one or more active components.

In this example embodiment, the module 8 includes several active components, including microwave signal amplifiers, connected in parallel, able to work in saturation according to an associated specification provided by the manufacturer of these active components.

As already explained above, in order to ensure proper operation of the electronic system 2, it is useful to control the operating compression rate of the active components of the module 8, based on the provided specification, in order to ensure good performance and cooperation without risk of damage.

To that end, the invention proposes a protection device 10 able to control the power level of the microwave electromagnetic signal S provided at the input of the module 8. Such a protection device 10 will be described in more detail below in reference to FIG. 2. The protection device 10 receives a microwave electromagnetic signal E from the amplifier system 6 as input. The protection device 10 includes two signal outputs, a first output 12 connected at the input of the module 8 and a second output 14 connected to a charge 16. The microwave electromagnetic signal E, called input signal, is conveyed toward the first output 12 if its power is below a predetermined power threshold and toward the second output 14 if its power is above this predetermined power threshold.

Advantageously, the protection device 10 makes it possible to preserve the integrity of the waveform of the microwave electromagnetic signal E, and the waveform of the electromagnetic output signal of the protection device 10 is therefore the same as that of the input signal E in the case of linear operation. As illustrated in FIG. 2, the power protection device 10 includes a switch-triggering device 20 and a delay module 22, mounted in parallel. The microwave electromagnetic input signal E is conveyed at the input of the delay module 22 via a coupler 24, toward an inductive delay line 26. The delay module 22 also comprises an amplifier 28 able to offset the power losses of the conveyed microwave electromagnetic signal due to the delay line 26. The switch-triggering device 20 includes a level measurer 30, for example a diode or a logarithmic detector, connected on the coupled branch from the coupler 24. The output level Vd of the level measurer 30 is continuously compared to a predetermined threshold, which is a level threshold Vs in this embodiment, using a comparator 32. The level threshold is for example provided by a digital-analog converter device 34, which is a programmable device outside the protection device 10 and programmable by a user.

Alternatively, other means making it possible to introduce a level threshold Vs, for example through another type of non-programmable external device, can be used. When the detected level Vd is above the level threshold Vs, the comparator 32 changes state, which activates a position change of the switch 36, connected at the output of the delay module 22. Thus, when the detected level Vd is above the level threshold Vs, the input of the switch 36 from the delay module 22 is connected on the second output 14 of the protection device 10. When the detected level Vd is below the level threshold Vs, the input of the switch 36 from the delay module 22 is connected on the first output 12 of the protection device 10.

In other words, the electromagnetic signal from the delay module 22 is conveyed over the first output of the protection device 10 only when its detected level Vd is below the predetermined level threshold Vs. The length of the delay line 26 is determined so as to ensure that this delay line provides a predetermined delay time Tr greater than the time comprised between the triggering of the switch by the switch-triggering device 20 and the position change of the switch 36. Thus, the delay module 22 introduces a sufficient delay for the switching of the switch 36 to be triggered systematically, if applicable, i.e., when Vd is greater than Vs, before the arrival of the electromagnetic signal at the input of the switch 36.

Advantageously, the delay time Tr is adjusted so as to limit the length of the delay line 26, while performing the switching function described above, thus also making it possible to limit the power loss introduced by the delay line 26, as well as the mass and volume of the protection device 10. For an inductive delay line, the length X of the line is associated with the delay time Tr by the formula: $X = v \cdot T_r$, where $$v = \frac{c}{\sqrt{\varepsilon_r}},$$

where c is the speed of light and $\varepsilon_r$ is the permittivity of the delay line. Thus, the length of such a delay line is easy to compute from the delay time Tr previously determined.

Advantageously, when a protection device 10 as described is introduced in an electronic system upstream from the connection of one or more active components, it makes it possible to check the power level of the signal provided to these active components. Thus, the compression rate of these components is checked for operation in saturation, which makes it possible to improve the overall performance of such an electronic system, to protect against fluctuations over time of the microwave electromagnetic input signal and to control the quality of the transmitted signal.

As an alternative to what has been described above, the protection device 10 can be integrated into an amplifier system 6. The protection device 10 according to the invention and the electronic system 2 using such a device have been described in particular for use with microwave electromagnetic signals in band X, with a frequency comprised between 8 and 12 GHz. However, the device according to the invention applies with microwave electromagnetic signals having a frequency above 0.1 GHz. According to the frequency band used, the principle of the invention applies similarly, but a device according to the invention can include different appropriate components. For example, the inductive coaxial delay line can be replaced by an optical delay line.

What is claimed is:

1. A device for protecting at least one active component of an electronic module, able to receive a microwave electromagnetic signal as input and to provide the microwave electromagnetic signal to at least one active component, comprising a delay module, a switch-triggering device, and a switch, the delay module able to apply a predetermined delay time to the microwave electromagnetic input signal, the delay module connected in parallel with the switch-triggering device, the switch-triggering device able to compare a power level of the microwave electromagnetic input signal to a power threshold and to command switching by the switch connected at the output of the delay module, an output of the switch providing the microwave electromagnetic input signal of the at least one active component, the predetermined delay time being such that the switching is done before the arrival of the microwave electromagnetic output signal from the delay module.

2. The device according to claim 1, wherein the delay module further comprises a coaxial inductive delay line with a length computed as a function of the predetermined delay time.

3. The device according to claim 2, wherein the length of the delay line is computed to ensure a delay time greater than the time between the triggering of the switching by the switch-triggering device and the position change of the switch.

4. The device according to claim 3, characterized in that the length X of the line is associated with the delay time Tr by the formula:

$X = v \cdot T_r$ where $$v = \frac{c}{\sqrt{\varepsilon_r}},$$

where c is the speed of light and $\varepsilon_r$ is the permittivity of the delay line.

5. The device according to one claim 2, wherein the delay line includes, at the output of the delay line, an amplifier able to offset a power loss caused by the delay line.

6. The device according to claim 1, wherein the switch-triggering device includes a power measurer and a level comparator, the comparator being able to compare an output level of the measurer to a level threshold.

7. The device according to claim 6, wherein the level threshold is provided by an external device.

8. The device according to claim 6, further where the output of the switch includes a first output and a second output, wherein the switch-triggering device is able to command, based on the comparison done by the comparator of the output level of the measurer compared to the level threshold, the position of the switch between a first position making it possible to convey the electromagnetic signal leaving the delay module toward the first output and a second position making it possible to convey the electromagnetic signal leaving the delay module toward the second output.

9. The device according to any claim 1, wherein the device is able to provide the at least one active component with a microwave electromagnetic signal having a frequency comprised between 0.1 GHz and 40 GHz.

10. An electronic system for amplifying microwave electromagnetic signals including a microwave electromagnetic signal transmitter, an amplification system connected at the output of the transmitter and a module with active components connected at the output of the amplification system, comprising a protection device according to claim 1 connected in series between the amplification system and the module with active components.

* * * * *